United States Patent
Koyanagi et al.

(10) Patent No.: US 9,234,692 B2
(45) Date of Patent: Jan. 12, 2016

(54) SUPERCONDUCTING MAGNETIC APPARATUS

(75) Inventors: Kei Koyanagi, Yokohama (JP); Taizo Tosaka, Yokohama (JP); Tsutomu Shimonosono, Yokohama (JP); Michitaka Ono, Kawasaki (JP); Tsutomu Kurusu, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 978 days.

(21) Appl. No.: 12/814,906

(22) Filed: Jun. 14, 2010

(65) Prior Publication Data

US 2010/0313574 A1    Dec. 16, 2010

(30) Foreign Application Priority Data

Jun. 15, 2009 (JP) ................. 2009-142137
Mar. 29, 2010 (JP) ................. 2010-076045

(51) Int. Cl.

| F25B 19/00 | (2006.01) |
| F25D 19/00 | (2006.01) |
| G01R 33/38 | (2006.01) |
| G01R 33/34 | (2006.01) |

(Continued)

(52) U.S. Cl.
CPC .............. F25D 19/006 (2013.01); F25D 19/00 (2013.01); G01R 33/3403 (2013.01); G01R 33/3804 (2013.01); H01F 6/04 (2013.01); F25B 9/10 (2013.01)

(58) Field of Classification Search
CPC .............. F25B 9/00; F25B 9/14; F25B 9/145; F25D 19/00; F25D 19/006; H01F 6/04; G01R 33/3804; G01R 33/3403; Y10S 505/892; Y10S 505/894

USPC .................................................. 505/163, 211
See application file for complete search history.

(56) References Cited

U.S. PATENT DOCUMENTS

| 4,935,714 A | 6/1990 | Vermilyea |
| 5,113,165 A | 5/1992 | Ackermann |
| 5,363,077 A | 11/1994 | Herd et al. |

(Continued)

FOREIGN PATENT DOCUMENTS

| JP | H01-134907 | 5/1989 |
| JP | H05-021227 | 1/1993 |

(Continued)

OTHER PUBLICATIONS

Office Action received from United Kingdom Intellectual Property Office in corresponding application GB1009728.5, mailed Oct. 11, 2010.

(Continued)

*Primary Examiner* — Frantz Jules
*Assistant Examiner* — Keith Raymond
(74) *Attorney, Agent, or Firm* — Finnegan, Henderson, Farabow, Garrett & Dunner, LLP

(57) ABSTRACT

According to one embodiment, there is provided a superconducting magnetic apparatus that conductively cools a superconducting coil contained in a vacuum container with a cryogenic refrigerator. The superconducting magnetic apparatus includes a thermal conductor thermally connecting a cooling stage of the cryogenic refrigerator to the superconducting coil, a radiation blocking layer provided around the superconducting coil, and a coil supporting body supporting the superconducting coil by partial or entire contact with a surface of the superconducting coil.

9 Claims, 4 Drawing Sheets

(51) Int. Cl.
  *H01F 6/04* (2006.01)
  *F25B 9/10* (2006.01)

(56) References Cited

U.S. PATENT DOCUMENTS

| | | | |
|---|---|---|---|
| 5,424,643 A * | 6/1995 | Morich et al. | 324/318 |
| 5,446,433 A * | 8/1995 | Laskaris et al. | 335/216 |
| 5,584,184 A * | 12/1996 | Inaguchi et al. | 62/6 |
| 5,651,256 A * | 7/1997 | Herd | H01F 6/04 335/216 |
| 5,737,927 A * | 4/1998 | Takahashi | H01F 6/04 62/383 |
| 5,787,714 A * | 8/1998 | Ohkura et al. | 62/51.1 |
| 5,960,868 A * | 10/1999 | Kuriyama et al. | 165/135 |
| 2005/0155356 A1 * | 7/2005 | Frank et al. | 62/6 |
| 2005/0166600 A1 | 8/2005 | Mitsubori | |
| 2009/0093370 A1 * | 4/2009 | Kobayashi et al. | 505/211 |

FOREIGN PATENT DOCUMENTS

| | | |
|---|---|---|
| JP | 7-73758 | 3/1995 |
| JP | 7-142241 | 6/1995 |
| JP | 8-078737 | 3/1996 |
| JP | A-09-312210 | 12/1997 |
| JP | 10-26427 | 1/1998 |
| JP | 2756551 | 3/1998 |
| JP | 11-176629 | 7/1999 |
| JP | A-2000-114028 | 4/2000 |
| JP | 3082397 | 6/2000 |
| JP | A-2000-182821 | 6/2000 |
| JP | A-2001-068328 | 3/2001 |
| JP | 3486868 | 10/2003 |
| JP | 4095742 | 3/2008 |
| JP | A-2008-117734 | 5/2008 |
| JP | 2008-279917 | 11/2008 |
| JP | A-2008-283803 | 11/2008 |
| JP | 2009-270736 | 11/2009 |

OTHER PUBLICATIONS

Office Action received from Korean Patent Office in counterpart Korean application, mailed Apr. 26, 2012.

Notification of Reasons for Rejection received from Japanese Patent Office in Japanese Patent Application No. 2013-000114, mailed Aug. 6, 2013.

Office Action received from Japanese Patent Office in Japanese Patent application No. 2010-076045, mailed Sep. 25, 2012.

Office Action received from German Patent Office in German Patent Application No. 10 2010 023 739.6, received Apr. 15, 2013.

Notification of Reasons for Rejection received from Japanese Patent Office in Japanese Patent Application No. 2013-000114, mailed Oct. 29, 2013, and English translation. 16 pages.

First Office Action received from Japanese Patent Office in Japanese Patent Application No. 2013-000114, mailed Jul. 22, 2014.

* cited by examiner

SUPERCONDUCTING MAGNETIC APPARATUS

CROSS-REFERENCE TO RELATED APPLICATIONS

This application is based upon and claims the benefit of priority from Japanese Patent Applications No. 2009-142137, filed Jun. 15, 2009; and No. 2010-076045, filed Mar. 29, 2010; the entire contents of both of which are incorporated herein by reference.

FIELD

Embodiments described herein relate generally to a high-temperature superconducting magnetic apparatus of a system of conductively cooling a high-temperature superconducting coil by a cryogenic refrigerator.

BACKGROUND

In recent years, high-temperature superconducting tape materials, which are dramatically improved in property and lengthened, have been produced on a significantly larger scale. Therefore, application of the materials to various types of apparatus has been expected. For example, great advantages may be expected in applying a superconducting coil using a high-temperature superconducting tape material to an apparatus, such as a magnet for silicon monocrystal pulling or a magnetically suspended vehicle. Further, as cooling means for keeping a superconducting coil in the superconducting state, a system of storing the superconducting coil in a vacuum container and conductively cooling the superconducting coil by a cryogenic refrigerator begins to be adopted instead of a system of immersing the superconducting coil in a cryogenic coolant such as liquid helium.

In a case of using an oxide superconducting coil, which has a relatively high critical temperature, as well as a case of using a metal-based superconducting coil, a shield plate is used to block radiation from a vacuum container. As disclosed in Japanese Patents Nos. 2756551, 4095742 and 3486868, a space between a shield plate and a superconducting coil is a vacuum. To reduce a thermal load to the superconducting coil, the superconducting coil must be fixed by a coil supporting member, which has a delicate structure having a small cross-sectional area and which is passed through the shield plate. In addition, a thermal anchor must be provided at the position of the shield plate. Therefore, the mechanical strength of the magnetic apparatus may be low. Furthermore, since the coil supporting member has a delicate structure, production of the member is time-consuming and costly.

Japanese Patent No. 3082397 discloses an apparatus which conductively cools a high-temperature superconducting coil by a cryogenic refrigerator. In this apparatus, to reduce thermal radiation from a room temperature or entry of heat from a current lead, it is necessary to provide a shield plate and a two-stage cryogenic refrigerator and to cool the shield plate in the first stage of the cryogenic refrigerator. Although the superconducting coil uses a high-temperature superconducting material, the problem described above cannot be avoided.

The superconducting magnetic apparatus of the system of conductively cooling the superconducting coil by the cryogenic refrigerator described above generally uses a two-stage cryogenic refrigerator which achieves a temperature of about 4K or lower. However, the two-stage cryogenic refrigerator has a problem with reliability in long-term operation since the refrigerating capacity is considerably influenced by a change in the thermal load. Moreover, since the delicate supporting structure is used to reduce the thermal load in a cryogenic portion, the mechanical strength of the apparatus is low and much time and expenses are required to produce the apparatus. Alternatively, a single-stage cryogenic refrigerator may be used to cool the superconducting coil. The single-stage cryogenic refrigerator achieves a temperature of only about 20K but has a high refrigerating capacity and brings efficiency several times as high as that in the two-stage cryogenic refrigerator. In the case of using the single-stage cryogenic refrigerator, however, the thermal load on the superconducting coil may be increased by the thermal conduction or radiation. As a result, the temperature variation may occur inside the coil.

Under those circumstances, there is a demand for providing a superconducting magnetic apparatus with a simple supporting structure, which has high reliability and realizes cost reduction.

DETAILED DESCRIPTION

Embodiments of the present invention will be described below with reference to the drawings. In general, according to one embodiment, there is provided a superconducting magnetic apparatus that conductively cools a superconducting coil contained in a vacuum container with a cryogenic refrigerator. The superconducting magnetic apparatus includes a thermal conductor thermally connecting a cooling stage of the cryogenic refrigerator to the superconducting coil, a radiation blocking layer provided around the superconducting coil, and a coil supporting body supporting the superconducting coil by partial or entire contact with a surface of the superconducting coil.

(First Embodiment)

Figure 1:
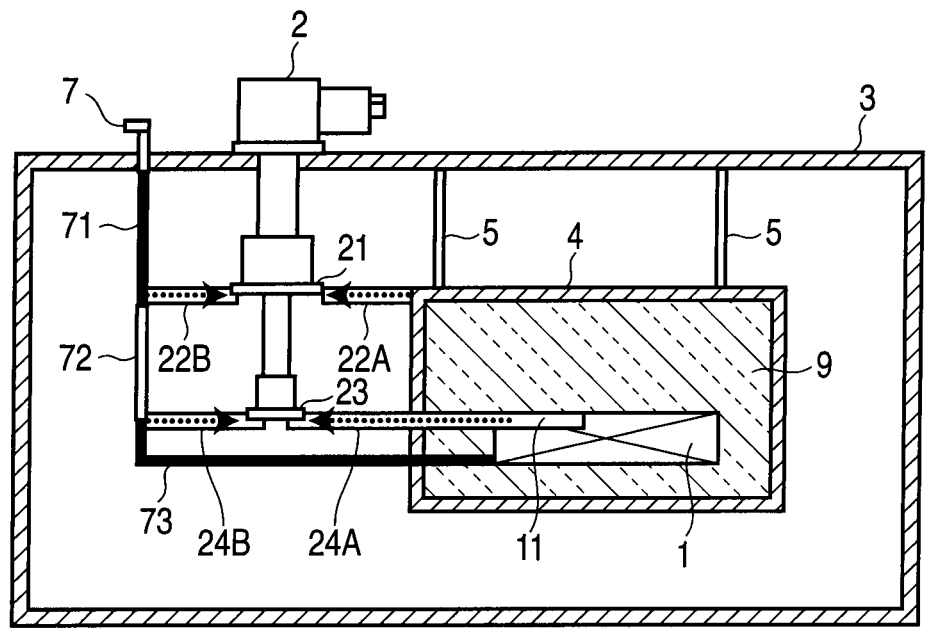
FIG. 1 is a schematic longitudinal cross-sectional view showing an example of a configuration of a superconducting magnetic apparatus according to a first embodiment.

A first embodiment will now be described with reference to FIG. 1. FIG. 1 is a schematic longitudinal cross-sectional view showing an example of a configuration of a superconducting magnetic apparatus according to the first embodiment.

The superconducting magnetic apparatus of the first embodiment is a high-temperature superconducting magnet adopting a system of conductively cooling a superconducting coil contained in a vacuum container by a cryogenic refrigerator. Main components of the superconducting magnetic apparatus are a superconducting coil 1, a two-stage cryogenic refrigerator 2, a vacuum container 3, a radiation blocking layer 4, a supporting member 5, a current introducing terminal 7 and a coil supporting body 9. The superconducting coil 1 is provided with a high-thermal-conductivity member 11. The cryogenic refrigerator 2 includes a first stage 21 of the two-stage cryogenic refrigerator, first stage heat transfer members 22A and 22B, a second stage 23 of the two-stage cryogenic refrigerator, and second stage heat transfer members 24A and 24B. The current introducing terminal 7 includes a feeder (current lead) 71, an oxide superconducting current lead 72 and a feeder (current lead) 73.

The superconducting coil 1 is cylindrical. In a cross-sectional view taken along a central axis, two separate coil sections are shown on the respective sides of the central axis. However, to avoid the complexity of the drawing, the coil section of only one side is shown in FIG. 1 (also in FIG. 2 to FIG. 5 to be described later).

In the superconducting magnetic apparatus, the superconducting coil 1, the high-thermal-conductivity member 11 and the radiation blocking layer 4 are integrally connected by the coil supporting body 9 as a single unit including the coil supporting body 9. This integral connection is achieved by at least one of adhesion by resin, impregnation, pressure welding, vapor deposition, screwing and concave-convex fitting. As a result, the connection can be firm and the assembly can be easy and mechanically stable.

The superconducting coil 1 is a high-temperature superconducting coil, which is formed by winding a high-temperature superconducting tape material. The high-temperature superconducting tape material is made of, for example, a tape-shaped metal substrate, an intermediate layer formed thereon, and a superconducting layer and a good-conductivity stabilizing metal layer which are formed on the intermediate layer. The superconducting coil 1 is cooled by the high-thermal-conductivity member 11 with cryogenic chill generated by the second stage 23 of the two-stage cryogenic refrigerator. The high-thermal-conductivity member 11 is attached to the superconducting coil 1 and carries out high thermal conduction between the superconducting coil 1 and the heat transfer members 24A and 24B. The high-thermal-conductivity member 11 is made of a member having a high thermal conductivity, for example, highly refined metal or aluminum nitride.

The two-stage cryogenic refrigerator 2 generates cryogenic chill through the two cooling stages. It may be, for example, a two-stage 4K-GM (Gifford-McMahon) cryogenic refrigerator, which can achieve a low temperature of about 4K or lower. The first stage 21 of the two-stage cryogenic refrigerator conductively cools the feeder 71 and the radiation blocking layer 4 through the first stage heat transfer members 22A and 22B with the chill generated in a process up to a final stage. The first stage heat transfer members 22A and 22B carry out thermal conduction between the feeder 71 (and the oxide superconducting current lead 72) and the first stage 21 of the two-stage cryogenic refrigerator and between the radiation blocking layer 4 and the first stage 21 of the two-stage cryogenic refrigerator. The second stage 23 of the two-stage cryogenic refrigerator conductively cools the feeder 73 (and the oxide superconducting current lead 72) and the conduction coil 1 through the second stage heat transfer members 24A and 24B with the chill generated therein as the final stage. The second stage heat transfer members 24A and 24B carry out thermal conduction between the feeder 73 (and the oxide superconducting current lead 72) and the second stage 23 of the two-stage cryogenic refrigerator and between the superconducting coil 1 (and the high-thermal-conductivity member 11) and the second stage 23 of the two-stage cryogenic refrigerator. The second stage heat transfer member 24A located between the superconducting coil 1 (and the high-thermal-conductivity member 11) and the second stage 23 of the two-stage cryogenic refrigerator has a heat transfer path of a larger cross-sectional area or a shorter length or is formed of a purer metal material as compared to the second heat transfer member 24B, so that the thermal resistance of the cooling path between the superconducting coil 1 and the second stage 23 of the two-stage cryogenic refrigerator can be low.

The vacuum container 3 contains a variety of components of the superconducting magnetic apparatus and the inside thereof is maintained under vacuum.

The radiation blocking layer 4 is a layer provided to cover the coil supporting body 9, which surrounds the superconducting coil 1. The radiation blocking layer 4 blocks radiation of a room temperature from the vacuum container 3. The radiation blocking layer 4 is made of, for example, aluminum or a composite material formed by combining aluminum and fiber-reinforced plastic in the thickness direction. The purity of aluminum used for the radiation blocking layer 4 is preferably at least 99%. As a result, the property for radiation blocking can be improved. An MLI (multilayer insulation material) may be provided outside the radiation blocking layer 4.

The supporting member 5 is a member that supports the superconducting coil 1, the high-thermal-conductivity member 11, the coil supporting body 9 and the radiation blocking layer 4, which are integrally connected. One end of the supporting member 5 is attached to a part of the vacuum container 3 and the other end thereof is attached to the radiation blocking layer 4 (or the coil supporting body 9).

The current introducing terminal 7 is a terminal for introducing a current. The feeders 71 and 73 are current leads which supply the current introduced through the terminal to the superconducting coil 1 via the oxide superconducting current lead 72. The oxide superconducting current lead 72 is a current lead, which is particularly effective to reduce entry of heat.

The coil supporting body 9 is provided between the superconducting coil 1 and the radiation blocking layer 4. The coil supporting body 9 functions as both a heat insulating layer having thermal resistance of a certain level or higher and a mechanical support for the superconducting coil 1. The coil supporting body 9 preferably includes, for example, a material made of resin or fiber-reinforced plastic. In the example shown in FIG. 1, a space between the superconducting coil 1 and the radiation blocking layer 4 is entirely filled with the coil supporting body 9. In other words, the coil supporting body 9 of this embodiment supports the superconducting coil 1 by contact with the overall surface thereof. As a result, the superconducting coil 1 is firmly supported.

The superconducting coil 1, the high-thermal-conductivity member 11, the coil supporting body 9 and the radiation blocking layer 4 may be bonded by adhesive, or connected by screwing. The radiation blocking plate 4 may be a plate member, or alternatively may be a material which is vapor-deposited on the coil supporting body 9. Because of the radiation blocking layer 4, the superconducting coil 1 can be more firmly supported and reinforced against external force such as vibrations.

When the superconducting magnetic apparatus having the configuration described above is operating, heat is generated due to an AC loss or very small resistance (flux flow resistance) of the superconducting coil 1. Heat is also generated from the feeders 71 and 73 and the oxide superconducting current lead 72. Further, radiation of a room temperature arises from the side of the vacuum container 3. At such a time, the radiation blocking layer 4 blocks the radiation of the room temperature from the side of the vacuum container 3 and the coil supporting body 9 inhibits thermal conduction between a room temperature portion on the side of the vacuum container 3 and the superconducting coil 1. Accordingly, a great temperature gradient occurs between the radiation blocking layer 4 and the superconducting coil 1.

The heat which the radiation blocking layer 4 receives is transferred to the first stage 21 of the two-stage cryogenic refrigerator through the first stage heat transfer member 22A. The heat from the feeder 71 (and the oxide superconducting current lead 72) is also transferred to the first stage 21 of the two-stage cryogenic refrigerator through the first stage heat transfer member 22B. On the other hand, the heat generated from the superconducting coil 1 is transferred to the second stage 23 of the two-stage cryogenic refrigerator through the high-thermal-conductivity member 11 and the second stage heat transfer member 24A. At this time, the heat resistance in the cooling path between the superconducting coil 1 and the second stage 23 of the two-stage cryogenic refrigerator is low. Further, the heat from the feeder 73 (and the oxide superconducting current lead 72) is also transferred to the second stage 23 of the two-stage cryogenic refrigerator through the second stage heat transfer member 24B.

In the conventional art, the space between the superconducting coil 1 and the radiation shield surrounding the superconducting coil 1 is a vacuum, and a delicate coil supporting member having a small cross-sectional area to reduce the entry of heat is attached to the superconducting coil 1 and the vacuum container 3 to support the superconducting coil 1. The first embodiment does not have such a configuration. Instead, the coil supporting body 9 is provided to simplify the support structure and suppress the thermal conduction by generating a great temperature gradient between the superconducting coil 1 and the radiation blocking layer 4. Furthermore, the thermal resistance only of the cooling path between the superconducting coil 1 and the second stage 23 of the two-stage cryogenic refrigerator is reduced by the configuration of the second stage heat transfer member 24A having a heat transfer path of a larger cross-sectional area or a shorter length as compared to the second heat transfer member 24B. Thus, the thermal load on the superconducting coil 1 can be reduced and the temperature variation inside the coil can be reduced. In addition, since the coil is supported by the coil supporting body 9 with higher mechanical strength as compared to the conventional coil supporting member, the superconducting coil 1 can be stably supported. Furthermore, since the conventional coil supporting member of a delicate structure is not required, the component costs and the number of steps of the manufacturing process can be reduced.

(Second Embodiment)

A second embodiment will now be described with reference to FIG. 2. In the description of the second embodiment, the components which are the same as those of the first embodiment shown in FIG. 1 are identified by the same reference numerals as those used for the first embodiment and descriptions thereof are omitted. In the following, parts different from those of the first embodiment are mainly described.

Figure 2:
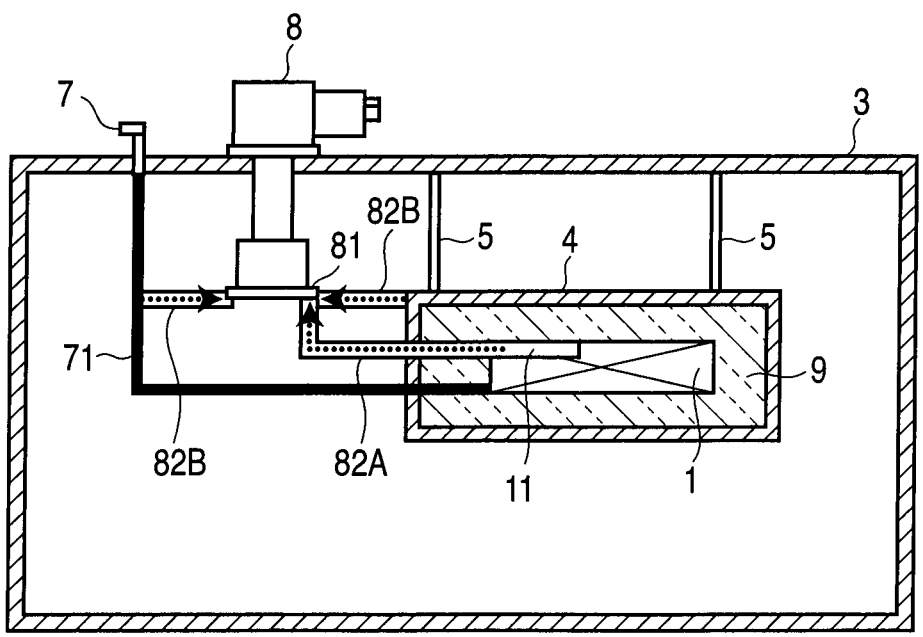
FIG. 2 is a schematic longitudinal cross-sectional view showing an example of a configuration of a superconducting magnetic apparatus according to a second embodiment.

FIG. 2 is a schematic longitudinal cross-sectional view showing an example of a configuration of a superconducting magnetic apparatus according to the second embodiment. While the superconducting magnetic apparatus of the first embodiment includes the two-stage cryogenic refrigerator 2, the superconducting magnetic apparatus of the second embodiment includes a single-stage cryogenic refrigerator 8. Accordingly, the second embodiment does not need the oxide superconducting current lead 72 described above. The single-stage cryogenic refrigerator 8 includes a cooling stage 81 and heat transfer members 82A and 82B.

The single-stage cryogenic refrigerator 8 generates cryogenic chill by the single cooling stage. For example, it may be a GM cryogenic refrigerator or a pulse tube-type cryogenic refrigerator, which can achieve a temperature of about 40K-50K. The cooling stage 81 is the only cooling stage of the cryogenic refrigerator of this embodiment. The cooling stage 81 cools all of the feeder 71, the radiation blocking layer 4 and the superconducting coil 1 through the heat transfer members 82A and 82B with the generated chill. The heat transfer members 82A and 82B carry out thermal conduction between the feeder 71 and the cooling stage 81, between the radiation blocking layer 4 and the cooling stage 81, and between the superconducting coil 1 (and the high-thermal-conductivity member 11) and the cooling stage 81. Thus, all of the superconducting coil 1, the high-thermal-conductivity member 11, the coil supporting body 9 and the radiation blocking layer 4 are thermally connected to the single cooling stage 81.

The thermal resistance of a first cooling path (a path passing through the heat transfer member 82A) thermally connecting the cooling stage 81 and the superconducting coil 1 is lower than that of a second cooling path (a path passing through the heat transfer member 82B) thermally connecting the cooling stage 81 and the radiation blocking layer 4.

When the superconducting magnetic apparatus having the configuration described above is operating, heat is generated due to an AC loss or very small resistance (flux flow resistance) of the superconducting coil 1. Heat is also generated from the feeder 71. Further, radiation of a room temperature from the side of the vacuum container 3 is applied to the side of the superconducting coil 1. At such a time, the radiation blocking layer 4 blocks the radiation of the room temperature from the side of the vacuum container 3 and the coil supporting body 9 inhibits thermal conduction between a room temperature portion on the side of the vacuum container 3 and the superconducting coil 1. Accordingly, a great temperature gradient occurs between the radiation blocking layer 4 and the superconducting coil 1.

The heat which the radiation blocking layer 4 receives is transferred to the cooling stage 81 through the heat transfer member 82B. The heat from the feeder 71 is also transferred to the cooling stage 81 through the heat transfer member 82B. Further, the heat generated from the superconducting coil 1 is also transferred to the cooling stage 81 through the high-thermal-conductivity member 11 and the heat transfer member 82A. An MLI (multilayer insulation material) may be provided outside the radiation blocking layer 4.

The second embodiment produces the same effect as that obtained by the first embodiment. In addition, since the single-stage GM cryogenic refrigerator or the single-stage pulse tube-type cryogenic refrigerator is used, refrigerating capacity of tens of Watt can be exercised at the temperature level of 40K and the superconducting coil can be efficiently cooled. Further, the superconducting magnetic apparatus can be obtained without using the oxide superconducting current lead 72, which is effective to reduce the entry of heat but expensive and mechanically brittle. Therefore, the initial costs can be reduced, while the reliability of the apparatus can be improved.

(Third Embodiment)

A third embodiment will now be described with reference to FIG. 3. In the description of the third embodiment, the components which are the same as those of the second embodiment shown in FIG. 2 are identified by the same reference numerals as those used for the second embodiment and descriptions thereof are omitted. In the following, parts different from those of the second embodiment are mainly described.

Figure 3:
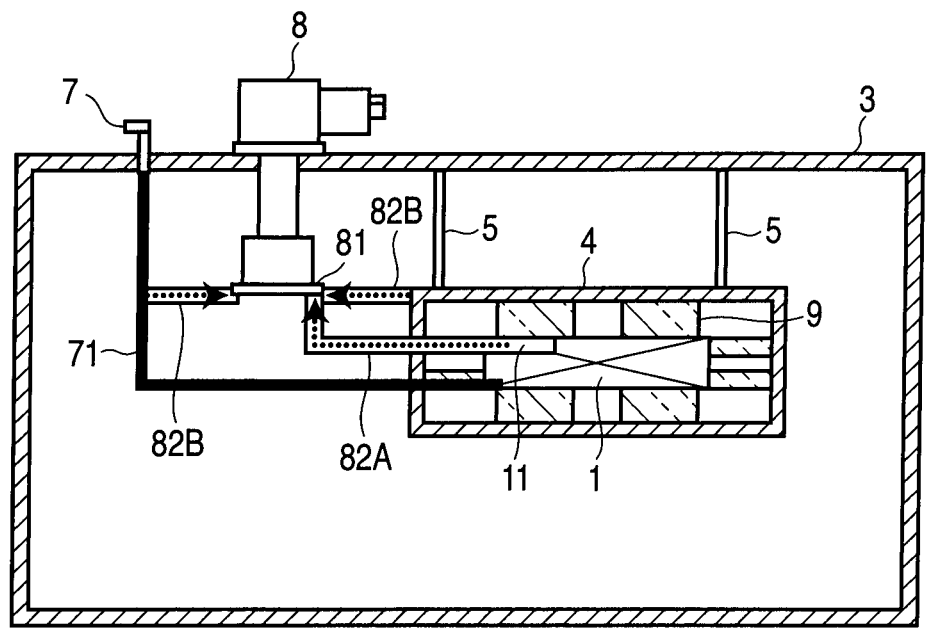
FIG. 3 is a schematic longitudinal cross-sectional view showing an example of a configuration of a superconducting magnetic apparatus according to a third embodiment.

FIG. 3 is a schematic longitudinal cross-sectional view showing an example of a configuration of a superconducting magnetic apparatus according to the third embodiment. In the superconducting magnetic apparatus of the second embodiment described above, the space between the superconducting coil 1 and the radiation blocking layer 4 is entirely filled with the coil supporting body 9. By contrast, in the superconducting magnetic apparatus of the third embodiment, the coil supporting body 9 is provided in only a part of the space between the superconducting coil 1 and the radiation blocking layer 4. The coil supporting body 9 of the third embodiment supports the superconducting coil 1 by partial contact with the surface thereof. Specifically, the coil support body 9 supports the superconducting coil 1 in a contact area therebetween, which excludes the part where the load factor is the highest.

In the superconducting coil 1, a distribution of a temperature margin (a temperature margin for transition to the normal conducting state) occurs depending on an empirical magnetic field of the coil. More specifically, a part in which the critical current value is lowered by a high empirical magnetic field has a small temperature margin (the load factor is high). On the other hand, a part in which the critical current value is high because of a relatively low magnetic field has a larger temperature margin relative to the same operation current value. If the coil supporting body 9 is in contact with the large temperature margin part of the superconducting coil 1, even if the heat by the radiation of the room temperature or the thermal conduction of the supporting member is transferred to the superconducting coil 1, the heat will not influence the portion where the load factor is the maximum, which determines the operation current value of the superconducting coil 1. As a result, the operation of the superconducting magnetic apparatus can be stable.

The coil supporting body 9 of this embodiment may be made of, for example, GFRP (glass fiber reinforced plastic), CFRP (carbon fiber reinforced plastic), fiber reinforced plastic such as bakelite or a resin. Further, it may be made of a hollow structure, such as a honeycomb structure, which has hollow portions. With this configuration, the mechanical strength of support can be maintained, while the high heat resistance to the superconducting coil 1 can be maintained.

The high-thermal-conductivity member 11 and the radiation blocking layer 4 may be made of high-purity metal materials. In this case, although an eddy current is generated by a change in external magnetic field, heat due to the eddy current can be reduced by providing the high-thermal-conductivity member 11 and the radiation blocking layer 4 with slits cutting across a large current loop on the surface where magnetic fluxes interlink. Further, an MLI (multilayer insulation material) may be provided outside the radiation blocking layer 4.

The third embodiment produces the same effect as that obtained by the second embodiment. In addition, the amount of the material for forming the coil supporting body can be reduced, thereby reducing the weight of the apparatus. Further, since the coil supporting body 9 is in contact with the large temperature margin part of the superconducting coil 1, the heat does not influence the portion where the load factor is the maximum, which determines the operation current value of the superconducting coil 1. Thus, the superconducting magnetic apparatus can be stably operated. Furthermore, since the coil supporting body 9 has a hollow structure, the mechanical strength of support can be maintained, while the high heat resistance to the superconducting coil 1 can be maintained. If high-purity metal materials are used for the high-thermal-conductivity member 11 and the radiation blocking layer 4, heat due to the eddy current can be reduced by forming slits cutting across a large current loop in the surface where magnetic fluxes interlink.

(Fourth Embodiment)

A fourth embodiment will now be described with reference to FIG. 4. In the description of the fourth embodiment, the components which are the same as those of the first to third embodiments shown in FIG. 1 to FIG. 3 are identified by the same reference numerals as those used for those embodiments and descriptions thereof are omitted. In the following, parts different from those of the second and third embodiments are mainly described.

Figure 4:
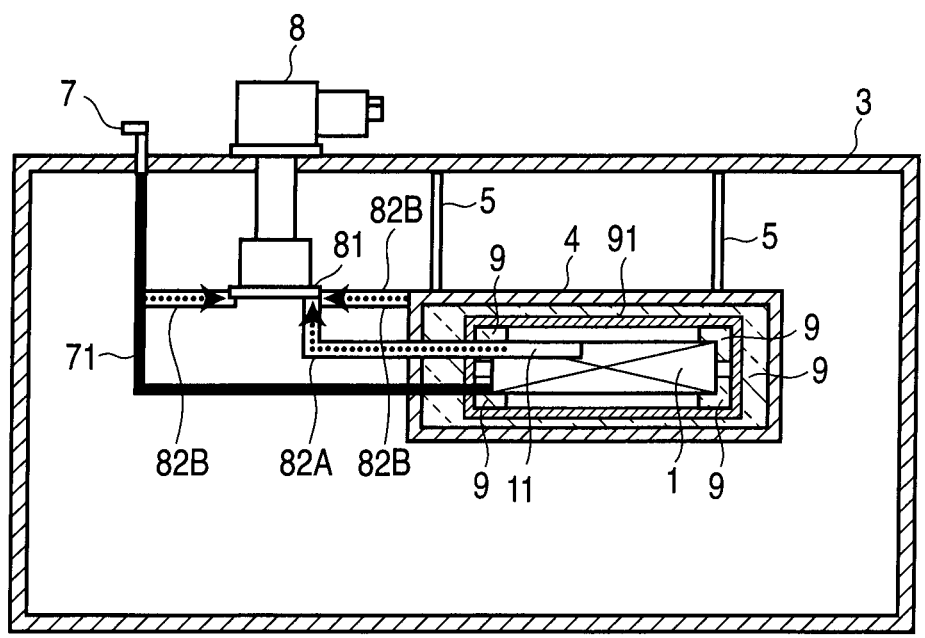
FIG. 4 is a schematic longitudinal cross-sectional view showing an example of a configuration of a superconducting magnetic apparatus according to a fourth embodiment.

FIG. 4 is a schematic longitudinal cross-sectional view showing an example of a configuration of a superconducting magnetic apparatus according to the fourth embodiment. In the superconducting magnetic apparatuses of the second and third embodiments, only the coil supporting body 9 is provided between the superconducting coil 1 and the radiation blocking layer 4. In the superconducting magnetic apparatus of the fourth embodiment, the superconducting coil 1 is stored in a container 91 via the coil supporting body 9 in advance, and a space between the container 91 and the radiation blocking layer 4 is entirely filled with the coil supporting body 9. The superconducting coil 1 is supported by the coil supporting body 9, which is provided in parts of the space between the superconducting coil 1 and the container 91. The container 91 is made of a metal, such as aluminum, or resin, as shown in FIG. 4.

The fourth embodiment produces the same effect as that obtained by the second and third embodiments. In addition, the amount of the material for forming the coil supporting body can be reduced, while the superconducting coil 1 can be separated from the radiation blocking layer 4 by the coil supporting body 9 outside the container 91. Moreover, the coil supporting body 9 can be put around the container 91 without exerting external force directly to the superconducting coil 1, which is an important part. Although FIG. 4 shows only one radiating blocking layer 4 outside the container 91, another radiation blocking layer 4 may be further provided outside the first-mentioned radiation blocking layer 4 with a coil supporting body 9 interposed therebetween. An MLI (multilayer insulation material) may also be provided outside the radiation blocking layer 4.

(Fifth Embodiment)

A fifth embodiment will now be described with reference to FIG. 5. In the description of the fifth embodiment, the components which are the same as those of the first to fourth embodiments shown in FIG. 1 to FIG. 4 are identified by the same reference numerals as those used for those embodiments and descriptions thereof are omitted. In the following, parts different from those of the fourth embodiment are mainly described.

Figure 5:
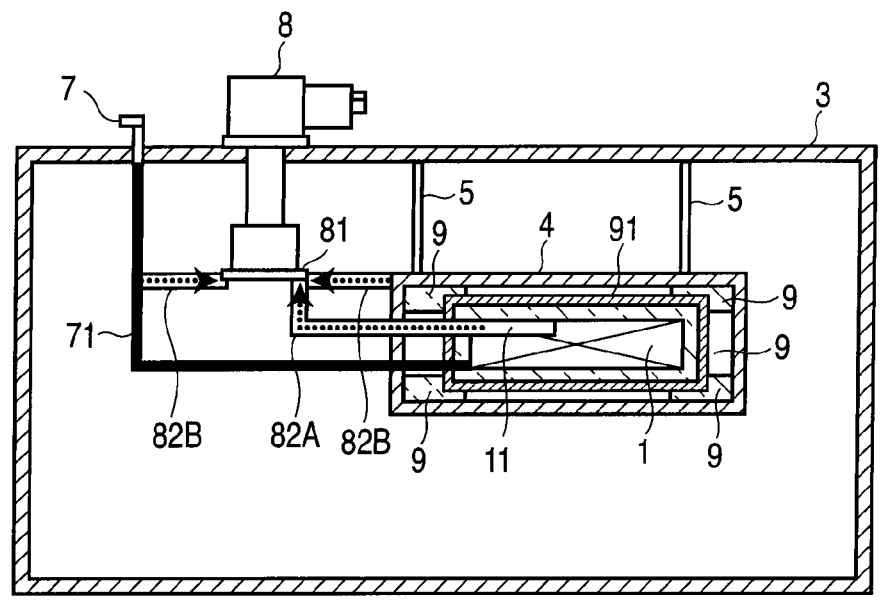
FIG. 5 is a schematic longitudinal cross-sectional view showing an example of a configuration of a superconducting magnetic apparatus according to a fifth embodiment.

FIG. 5 is a schematic longitudinal cross-sectional view showing an example of a configuration of a superconducting magnetic apparatus according to the fifth embodiment. In the superconducting magnetic apparatus of the fourth embodiment described above, the space between the superconducting coil 1 and the container 91 is partially provided with the coil supporting body 9, and the space between the container 91 and the radiation blocking layer 4 is entirely filled with the coil supporting body 9. In the superconducting magnetic apparatus of the fifth embodiment, the space between the superconducting coil 1 and the container 91 is entirely filled with the coil supporting body 9, while the space between the container 91 and the radiation blocking layer 4 is partially provided with the coil supporting body 9.

The fifth embodiment produces the same effect as that obtained by the second and third embodiments. In addition, the amount of the material for forming the coil supporting body can be reduced, while the superconducting coil 1 can be separated from the radiation blocking layer 4 by the coil supporting body inside the container 91. Further, the superconducting coil 1 is contained in the container 91 in advance and molded with resin, so that a temperature occurs in this portion. Since the container 91 containing the superconducting coil 1 is partially supported by the coil supporting body 9, the manufacturing process can be simplified and the apparatus as a whole can be light-weighted. Although FIG. 5 shows only one radiating blocking layer 4, a plurality of radiation blocking layers 4 may be provided with the coil supporting body 9 interposed therebetween. An MLI (multilayer insulation material) may also be provided outside the radiation blocking layer 4.

(Sixth Embodiment)

A sixth embodiment will be described with reference to FIG. 6 to FIG. 8. The following description relates to a method for suitably designing a superconducting magnetic apparatus using a model of an equivalent circuit which represents thermal conduction by analogy with electrical conduction.

Figure 6:
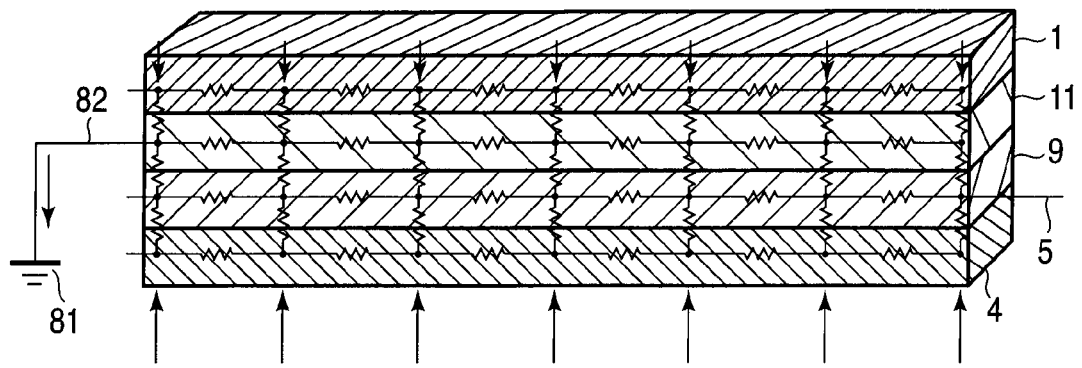
FIG. 6 is a schematic view showing a model of an equivalent circuit which represents, by analogy, thermal conduction in a superconducting coil, a high-thermal-conductivity member, a coil supporting body and a radiation blocking layer in the superconducting magnetic apparatus shown in FIG. 2 to FIG. 5.

FIG. 6 is a schematic view showing a model of an equivalent circuit which represents, by analogy with electrical conduction, thermal conduction in the superconducting coil 1, the high-thermal-conductivity member 11, the coil supporting body 9 and the radiation blocking layer 4 in the superconducting magnetic apparatus shown in FIG. 2 to FIG. 5. In FIG. 6, the components which are the same as those of the first to fifth embodiments are identified by the same reference numerals as those in FIG. 2 to FIG. 5.

In FIG. 6, arrows above the superconducting coil 1 represent heat generated by an AC loss or very small resistance (flux flow resistance) of the superconducting coil 1. Arrows under the radiation blocking layer 4 represent a thermal load due to radiation of a room temperature from the vacuum container 3. A right portion of FIG. 6 shows that heat from the supporting member 5 enters the coil supporting body 9. A central portion of FIG. 6 shows, with a plurality of resistors, heat resistance that occurs in every part of the superconducting coil 1, the high-thermal-conductivity member 11, the coil supporting body 9 and the radiation blocking layer 4. A left portion of FIG. 6 shows that the heat is transferred from the high-thermal-conductivity member 11 to the cooling stage 81 through the heat transfer member 82.

Table 1 shows two design examples (Examples 1 and 2) using as parameters a cross-sectional area ratio of the high-thermal-conductivity member 11, a cross-sectional area ratio of the coil supporting body 9 and a thickness ratio of the radiation blocking layer 4 in the model shown in FIG. 6.

TABLE 1

|  | Example 1 | Example 2 |
| --- | --- | --- |
| Cross-sectional area ratio of high-thermal conductivity member | 1 | 2 |
| Cross-sectional area ratio of coil supporting body | 1 | 4 |
| Thickness ratio of radiation blocking layer | 1 | 2.5 |
| Heat resistances |  |  |
| Coil | 190 K/W | 190 K/W |
| High-thermal conductivity member | 0.618 K/W | 0.309 K/W |
| Coil supporting body | 2065 K/W | 516 K/W |
| Radiation blocking layer | 8.05 K/W | 3.22 K/W |
| Coil supporting body (in thickness direction) | 0.0346 K/W | 0.138 K/W |
| Maximum temperature of superconducting coil | 37.5 K | 33.6 K |
| Temperature variation inside superconducting coil | 7.5 K | 3.6 K |

Table 1 indicates the cross-sectional area ratio of the high-thermal-conductivity member 11, the cross-sectional area ratio of the coil supporting body 9 and the thickness ratio of the radiation blocking layer 4 as three parameters. Under these parameters, value of the heat resistances (corresponding to resistors in the equivalent circuit) in the respective parts with respect to the three parameters of each example are indicated; that is, the values of the heat resistances of the superconducting coil 1, the high-thermal-conductivity member 11, the coil supporting body 9, the radiation blocking layer 4 and the coil supporting body (in the thickness direction) are indicated. Under the values of the resistances, the maximum temperature of the superconducting coil 1 and the temperature variation inside the superconducting coil 1 are indicated.

Figure 7:
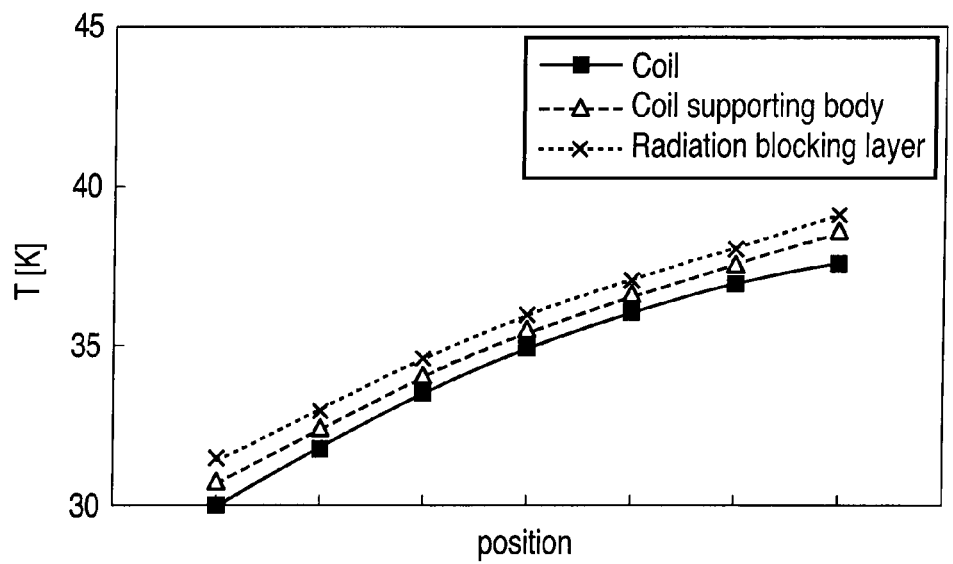
FIG. 7 is a graph showing temperature distributions in parts in the model shown in FIG. 6 under various set conditions.
Figure 8:
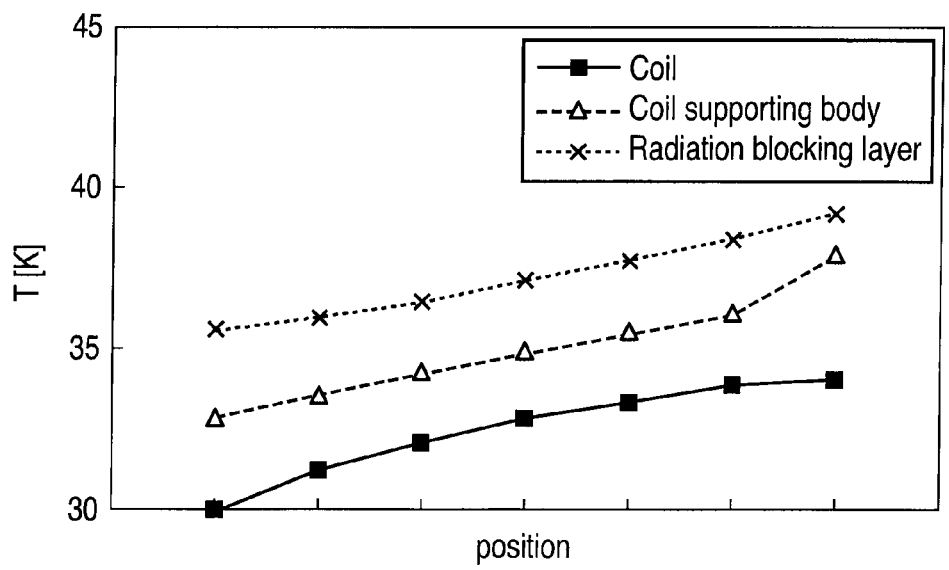
FIG. 8 is a graph showing temperature distributions in the parts in the model shown in FIG. 6 under other set conditions.

FIGS. 7 and 8 show results of temperature distributions of the superconducting coil 1, the coil supporting body 9, the radiation blocking layer 4 calculated from a predetermined model formula based on the equivalent circuit shown in FIG. 6. FIGS. 7 and 8 respectively correspond to Examples 1 and 2 shown in Table 1.

In Examples 1 and 2, the sums of the thermal loads of all parts are substantially the same. The resistances of the respective parts of the equivalent circuit shown in FIG. 6 can be changed by changing the conditions as indicated in Table 1. As a result, different temperature distributions in the superconducting coil 1, the coil supporting body 9 and the radiation blocking layer 4 can be recognized as shown in the graphs of FIGS. 7 and 8. Thus, suitable design conditions can be found out.

Further, as indicated in Table 1, the thermal conductivity, the cross-sectional area and the path length can be set such that the coil supporting body 9 has a heat resistance at least 100 times higher than that of the high-thermal-conductivity member. Accordingly, the superconducting coil 1 can be efficiently cooled to lower the temperature peak value, so that a sufficient temperature margin can be ensured. As a result, a magnetic field can efficiently be generated in the superconducting magnetic apparatus without increasing the number of winding turns or impairing the stability.

According to the embodiments described above, a superconducting magnetic apparatus is provided, which is simple in supporting structure, highly reliable, and low in cost.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A superconducting magnetic apparatus that conductively cools a superconducting coil contained in a vacuum container with a cryogenic refrigerator having a sole cooling stage, comprising:
    a thermal conductor integrally and thermally connecting the sole cooling stage of the cryogenic refrigerator to the superconducting coil;
    a radiation blocking layer provided to cover whole surroundings of the superconducting coil; and
    a coil supporting body supporting the superconducting coil by partial or entire contact with a surface of the superconducting coil, the coil supporting body being provided between the superconducting coil and the radiation blocking layer, the coil supporting body functioning as a heat insulator,
    wherein the superconducting coil, the coil supporting body and the radiation blocking layer are each independently and thermally connected to the sole cooling stage of the cryogenic refrigerator via connection with the thermal conductor, and
    wherein the coil supporting body surrounds the superconducting coil and is provided in a space between the superconducting coil and the radiation blocking layer, and the superconducting coil and the radiation blocking layer are integrally connected by containing the coil supporting body therebetween to form a single unit.

2. The superconducting magnetic apparatus of claim 1, wherein the superconducting coil and the radiation blocking layer are separated by the coil supporting body.

3. The superconducting magnetic apparatus of claim 2, wherein the integral connections are implemented using at least one of adhesion by resin, impregnation, pressure welding, vapor deposition, screwing and concave-convex fitting.

4. The superconducting magnetic apparatus of claim 1, wherein the thermal conductor includes:
    a first heat transfer member integrally and thermally connecting the sole cooling stage of the cryogenic refrigerator to the superconducting coil, and
    a second heat transfer member integrally and thermally connecting the sole cooling stage of the cryogenic refrigerator to the radiation blocking layer,
    wherein a thermal resistance of the first heat transfer member is lower than that of the second heat transfer member.

5. The superconducting magnetic apparatus of claim 4, wherein the cryogenic refrigerator is a GM cryogenic refrigerator or a pulse tube-type cryogenic refrigerator, which has the sole cooling stage.

6. The superconducting magnetic apparatus of claim 1, wherein the coil supporting body supports the superconducting coil by partial contact with the surface of the superconducting coil, and a support portion of the coil supporting body supports the superconducting coil in an area which excludes a part where a load factor of the superconducting coil is the highest.

7. The superconducting magnetic apparatus of claim 1, wherein the coil supporting body is made of a hollow structure having a hollow portion.

8. The superconducting magnetic apparatus of claim 1, wherein the thermal conductor and the radiation blocking layer have slits that cut across an eddy current loop, which occurs due to a change in an external magnetic field.

9. The superconducting magnetic apparatus of claim 1, wherein the radiation blocking layer is made of aluminum or a composite material formed by combining aluminum and fiber-reinforced plastic in a thickness direction, and the purity of aluminum used for the radiation blocking layer is at least 99%.

* * * * *